United States Patent [19]
Ishikawa et al.

[11] Patent Number: 6,100,554
[45] Date of Patent: Aug. 8, 2000

[54] HIGH-FREQUENCY SEMICONDUCTOR DEVICE

[75] Inventors: Yohei Ishikawa, Kyoto; Koichi Sakamoto, Otsu, both of Japan

[73] Assignee: Murata Manufacturing Co., Ltd., Japan

[21] Appl. No.: 08/879,534

[22] Filed: Jun. 20, 1997

[30] Foreign Application Priority Data

Jun. 20, 1996 [JP] Japan .................................. 8-181440

[51] Int. Cl.⁷ ........................ H01L 29/80; H01L 31/112
[52] U.S. Cl. ..................... 257/275; 257/347; 257/350; 257/368; 257/379; 333/204; 333/247
[58] Field of Search .................................. 257/275, 368, 257/347, 350, 379; 333/204, 247

[56] References Cited

U.S. PATENT DOCUMENTS

| | | | |
|---|---|---|---|
| 4,479,100 | 10/1984 | Moghe et al. | 333/33 |
| 4,996,582 | 2/1991 | Nagahama | 357/69 |
| 5,256,996 | 10/1993 | Marsland et al. | 333/20 |

FOREIGN PATENT DOCUMENTS

| | | | |
|---|---|---|---|
| 0472357 | 2/1992 | European Pat. Off. | 257/275 |
| 60-107846 | 6/1985 | Japan | 257/275 |

*Primary Examiner*—William Mintel
*Attorney, Agent, or Firm*—Ostrolenk, Faber, Gerb & Soffen, LLP

[57] ABSTRACT

An intrinsic device section is provided by laminating a drain area, an intermediate area, and a source area above a GaAs substrate and by forming a channel area at one oblique surface thereof. A drain electrode ohmic connected to the drain area extends toward the output side, a source electrode ohmic connected to the source area extends above the drain electrode with a dielectric layer placed therebetween, and thereby an output micro-wave transmission line is formed. A gate electrode Schottky connected to the channel area extends toward the input side, the source electrode extends above the drain electrode with the dielectric layer placed therebetween, and thereby an input micro-wave transmission line formed.

9 Claims, 9 Drawing Sheets

HIGH-FREQUENCY SEMICONDUCTOR DEVICE

BACKGROUND OF THE INVENTION

1. Field of the Invention

The present invention relates to high-frequency semiconductor devices. The present invention more particularly relates to a high-frequency field effect transistor (FET) used for a millimetric-wave or quasimillimetric-wave circuit module for amplification, oscillation, and modulation.

2. Description of the Related Art

FIG. 1 is a plan view showing a structure of an electrode formed on a semiconductor surface in a high-frequency FET in common use. In this high-frequency semiconductor device, three source electrodes 2 extend from a source pad section 1 and two drain electrodes 4 extending from a drain pad section 3 are disposed between the source electrodes 2. Four very long, narrow gate electrodes 6 extending from two gate pad sections 5 disposed between the tip of the drain electrodes 4 and the source pad section 1 extend in areas sandwiched by the source electrodes 2 and the drain electrodes 4. In other words, this high-frequency semiconductor device is a horizontal-type (plane-type) FET in which the source electrodes 2, the gate electrodes 6, and the drain electrodes 4 are formed on the same plane.

To make such an FET usable at higher frequencies, it is necessary to reduce the distance between the source electrode and the drain electrode and to narrow a gate electrode (reduce the gate length). A narrow and long gate electrode has large parasitic resistance and large, parasitic capacitance, however, and thereby the characteristics deteriorate by noise increase, operating-frequency decrease, gain reduction, and increased input/output reflection loss. To form a narrow and long gate electrode, an advanced fine machining technology (especially advanced photolithography) is required. However, such technology increases variations in characteristics and reduces yield.

When the FET is viewed as a waveguide which transmits a micro wave, it has very unnatural structure and its operating range is limited to a low frequency zone in which the FET can be approximated to a lumped-constant circuit device.

FIG. 2 is a plan view illustrating an electrode structure of an air-bridge-gate-structure FET which improves the above describes characteristics deterioration. In this structure, a source electrode 8 disposed between source pad sections 7 on a semiconductor surface faces a drain electrode 9 over its full length. A wide gate electrode 11 extends over the source electrode 8 from a gate pad section 10 disposed at the side opposite the drain electrode 9 against the source electrode 8, and the edge of the gate electrode 11 is Schottky-connected to the semiconductor surface between the source electrode 8 and the drain electrode 9.

Since the gate electrode 11 can be made wide in such an air-bridge-gate-structure FET, the parasitic resistance and the parasitic inductance of the gate electrode 11 are reduced and the RF characteristics (especially noise characteristics) are improved.

At a portion where the gate electrode 11 passes over the source electrode 8, a parasitic capacitor is generated between the source electrode 8 and the gate electrode 11, which decreases the operating frequency. To reduce this parasitic capacitance, the source electrode 8 needs to be narrowed. If the source electrode 8 is narrowed, since the source electrode 8 has additional parasitic resistance and additional parasitic inductance, characteristics improvement is limited in such a method. Also in this air-bridge-gate-structure FET, a fine machining technology for a gate electrode is not easily implemented in the same way as for a horizontal-type FET.

When this air-bridge-gate-structure FET is viewed as a waveguide, it has very unnatural structure like a horizontal-type FET, and its operating range is limited to a low frequency zone in which the FET can be approximated to a lumped-constant circuit device.

To solve the problem of characteristics deterioration of a high-frequency FET in millimetric-wave and quasi-millimetric-wave ranges, it is an important issue to improve precision in machining a gate electrode and to eliminate wiring resistors and parasitic components such as parasitic capacitors and parasitic inductors in the gate electrode and the drain electrode, as described above. It is very difficult, however, to suppress characteristics deterioration in a high-frequency range in a conventional FET structure, and a semiconductor device suited to a millimetric wave and a quasimillimetric wave cannot be manufactured.

SUMMARY OF THE INVENTION

The present invention is made in consideration of the above-described drawbacks in a conventional device. Accordingly, it is an object of the present invention to suppress characteristics deterioration of a semiconductor device in a high-frequency range by using the structure of a micro-wave transmission line in the electrode structure between the gate electrode and the source electrode and between the drain electrode and the source electrode.

The foregoing object is achieved according to one aspect of the invention through the provision of a high-frequency semiconductor device including: an intrinsic device section partially formed by laminating a drain area, a channel area, and a source area above an insulating substrate; a micro-wave transmission line formed between a drain electrode connected to the drain area or an electrode section electrically connected to the drain electrode and a source electrode connected to the source area or an electrode section electrically connected to the source electrode; and a micro-wave transmission line formed between a gate electrode connected to the channel area or an electrode section electrically connected to the gate electrode and a source electrode connected to the source area or an electrode section electrically connected to the source electrode.

The foregoing object is also achieved according to another aspect of the invention through the provision of a high-frequency semiconductor device including: an intrinsic device section partially formed by laminating a drain area, a channel area, and a source area in this order from the bottom above an insulating substrate; a micro-wave transmission line formed between a drain electrode connected to the drain area or an electrode section electrically connected to the drain electrode and a source electrode connected to the source area or an electrode section electrically connected to the source electrode formed oppositely through a dielectric layer above the drain electrode or the electrode section electrically connected to the drain electrode; and a micro-wave transmission line formed between a gate electrode connected to the channel area or an electrode section electrically connected to the gate electrode and a source electrode connected to the source area or an electrode section electrically connected to the source electrode formed oppositely through a dielectric layer above the gate electrode or the electrode section electrically connected to the gate electrode.

The foregoing object is achieved according to still another aspect of the invention through the provision of a high-frequency semiconductor device including: an intrinsic device section partially formed by laminating a source area, a channel area, and a drain area in this order from the bottom above an insulating substrate; a micro-wave transmission line formed between a source electrode connected to the source area or an electrode section electrically connected to the source electrode and a gate electrode connected to the channel area or an electrode section electrically connected to the gate electrode formed oppositely through a dielectric layer above the source electrode or the electrode section electrically connected to the source electrode; and a micro-wave transmission line formed between a source electrode connected to the source area or an electrode section electrically connected to the source electrode and a drain electrode connected to the drain area or an electrode section electrically connected to the drain electrode formed oppositely through a dielectric layer above the source electrode or the electrode section electrically connected to the source electrode.

A high-frequency semiconductor device according to the present invention may be configured such that a plurality of the intrinsic device sections are disposed above the insulating substrate and the plurality of the intrinsic device sections are connected by micro-wave transmission lines.

Since a plurality of intrinsic device sections are disposed and they are connected with micro-wave transmission lines in the high-frequency semiconductor device, a larger output power is obtained than in a single intrinsic device section.

In a high-frequency semiconductor device according to the present invention, since an intrinsic device section is partially formed by laminating a drain area, a channel area, and a source area above an insulating substrate and the channel area is connected to a gate electrode, the gate length of such a semiconductor device is determined by the thickness of a crystal layer in the channel area. Therefore, as compared with a conventional horizontal-type FET, in which the gate length is determined by the width of a gate electrode formed by lithography, the gate length can be more controlled and a very short gate can be obtained.

Since in the present invention a micro-wave transmission line is formed between a drain electrode connected to a drain area and a source electrode connected to a source area, and a micro-wave transmission line is formed between a gate electrode connected to a channel area and a source electrode connected to a source area, parasitic components between the gate and source electrodes and between the drain and source electrodes can be reduced to improve the characteristics of the high-frequency semiconductor device.

Any types of micro-wave transmission lines can be used, such as a microstripline, a slot line, and a coplanar line. In a high-frequency semiconductor device according to the present invention, for example, the source electrode opposes the drain electrode with the dielectric layer disposed therebetween, or the source electrode opposes the gate electrode with the dielectric layer disposed therebetween to form a micro-wave transmission line similar to a microstripline.

As for the direction in which a drain area, a channel area, and a source area is laminated in a intrinsic device section, the drain area may be disposed closer to the substrate or the source area may be disposed closer to the substrate.

DESCRIPTION OF THE PREFERRED EMBODIMENTS

FIRST EMBODIMENT

Figure 3:
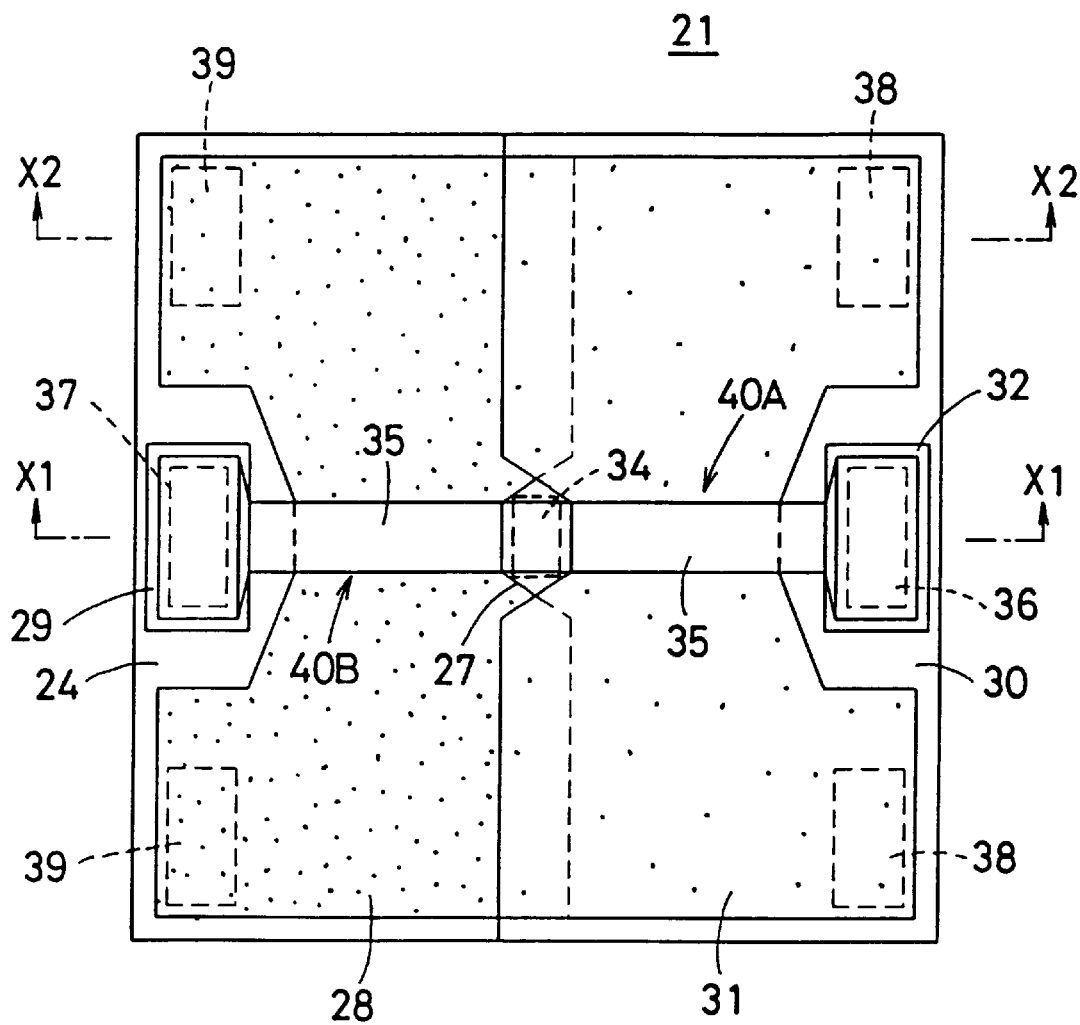
FIG. 3 is a plan view showing a structure of a high-frequency semiconductor device according to one embodiment of the present invention.
Figure 4:
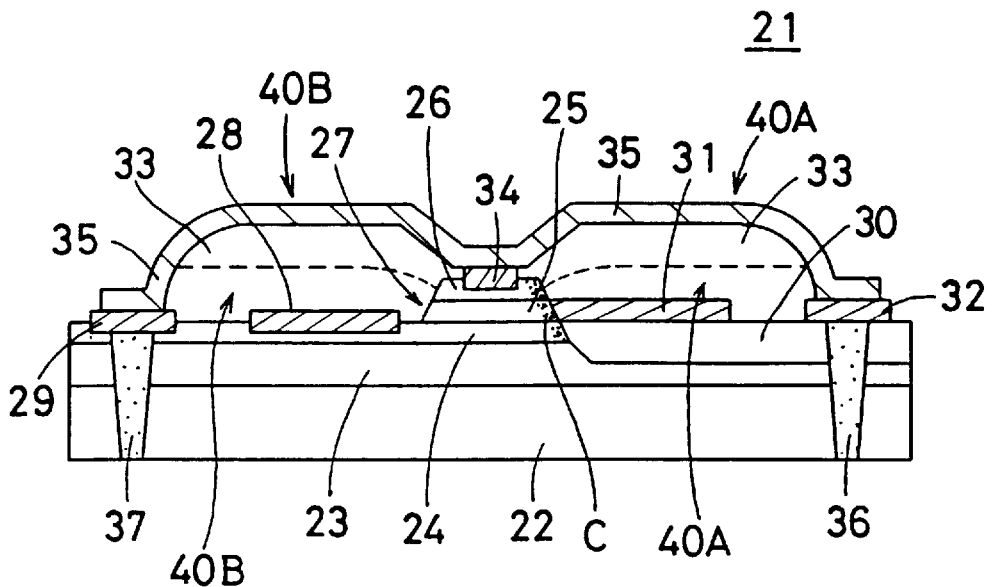
FIG. 4 is a cross sectional view taken on line X1—X1 shown in FIG. 3.
Figure 5:
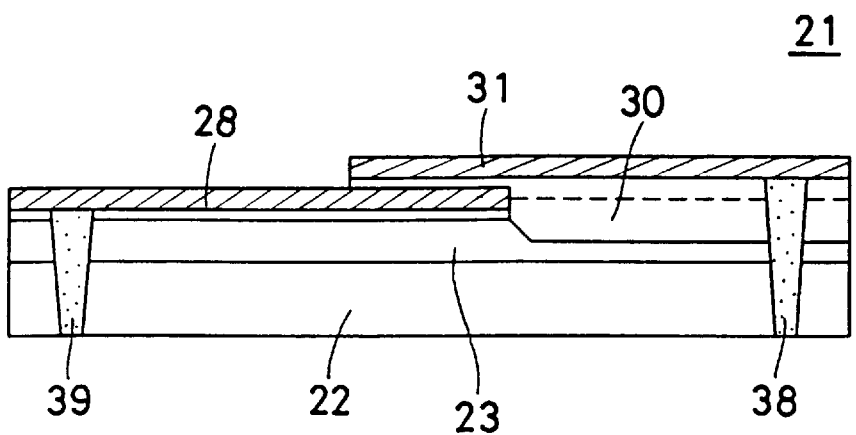
FIG. 5 is a cross sectional view taken on line X2—X2 shown in FIG. 4.

FIG. 3 is a plan view showing a structure of a high-frequency semiconductor device (high-frequency FET) 21 according to one embodiment of the present invention. FIG. 4 is a cross section sectional view taken on line X1—X1 shown in FIG. 3, and FIG. 5 is a cross sectional view taken on X2—X2 shown in FIG. 3. This high-frequency semiconductor device 21 has an intrinsic device section 27 having a vertical-type FET structure in which a drain area 24, a channel area 25, and a source area 26 are laminated in this order from the bottom.

(Manufacturing method and structure for the first embodiment)

A structure of the high-frequency semiconductor device 21 according to this embodiment will be described below together with a manufacturing method therefor by referring to FIGS. 3 to 5. On a semi-insulating GaAs substrate (GaAs wafer) 22, an undoped GaAs layer 23, a drain area 24 (film thickness: 0.2 $\mu$m) made from n-GaAs/InGaAs, an intermediate area 25 (film thickness: 0.15 $\mu$m) made from undoped GaAs (or AlGaAs), and a source area 26 (film thickness: 0.1 $\mu$m) made from n-InGaAs/GaAs are epitaxially grown by the molecular beam epitaxitial (MBE) method. The intermediate area 25 may be of the p-type.

The undoped GaAs layer 23, the drain area 24, the intermediate area 25, and the source area 26 are etched by photolithography to form the mesa-type intrinsic device section 27 which has a hexagonal shape when viewed from the top, at an appropriate position in the GaAs substrate 22, for example, at the center of the FET area. One end of the intrinsic device section 27 is etched in a first etching process until the drain area is exposed, and the intrinsic device section 27 is etched in a second etching process until the undoped GaAs layer 23 is exposed. The intrinsic device layer 27 formed in this way has a three-layer structure made from the drain area 24, the intermediate area 25, and the source area 26. In this manufacturing stage, at one end (output side) of the intrinsic device section 27, the drain area 24 is exposed such that it extends from the foot of the intrinsic device section 27, and at the other end (input side), the undoped GaAs layer 23 is exposed at a stage lower than the surface on which the drain area 24 is exposed.

After the mesa-type intrinsic device section 27 in which the drain area 24, the intermediate area 25, and the source area 26 are laminated is formed, n-type ions are injected to one oblique surface of the intrinsic device section 27 to form a channel area C.

On the exposed drain area 24 (substantially a half of the GaAs substrate 22), a drain electrode 28 made from an electrode material such as Au/Ge is formed. The drain electrode 28 is formed in the specified pattern as shown in FIG. 3. The drain electrode 28 covers substantially a half of the GaAs substrate 22 except for the intrinsic device section 27 at the inner edge and an area where a source pad section 29 is formed at the outer edge. Heat treatment is applied to the drain electrode 28, and then the electrode is ohmic connected to the drain area 24.

In the manufacturing process for the drain electrode 28, the source pad section 29 is formed at the same time at the area for the section where the drain electrode 28 does not cover, by use of the same electrode material as for the drain electrode 28.

An insulating layer 30 made from $SiO_2$ or SiN is deposited for the entire area of the GaAs substrate 22 by the CVD method such that the drain electrode 28 is exposed except for the tip of the drain electrode 28 and the surface of the insulating layer 30 is flattened. On the insulating layer 30, a gate electrode 31 made from a Schottky electrode material such as TiN is formed. The gate electrode 31 is formed in the specified pattern as shown in FIG. 3. The gate electrode 31 covers substantially the other half of the GaAs substrate 22, overlaps with the drain electrode 28 at the inner edge through the insulating layer 30, and does not cover the area where a source pad section 32 is to be formed at the outer edge. The gate electrode 31 does not cover the intrinsic device section 27 at the inner edge and is Schottky connected there to the channel area C.

In the manufacturing process for the gate electrode 31, the source pad section 32 is formed at the same time at the area where the gate electrode 31 is removed, by use of the same electrode material as for the gate electrode 31.

Since the drain electrode 28 and the gate electrode 31 are partially overlapped through the thin insulating layer 30 as shown in FIG. 5, they are electrically capacitive-connected through a thin-film capacitor (insulating layer 30) serving as a common RF ground electrode.

For the entire area of the GaAs substrate 22, two dielectric layers (insulating members) 33 made from SiN, PSG, or $SiO_2$ are formed. The dielectric layers 33 are etched at the center to expose the upper surface of the intrinsic device section 27 (source area 26) and are also etched at ends to expose the source pad sections 29 and 32. On the exposed upper surface of the source area 26, an ohmic-contact electrode 34 made from an electrode material such as Au/Ge is formed in ohmic-contact with the source area 26.

A source electrode 35 is formed on the dielectric layers 33 such that the source electrode 35 is connected to the ohmic-contact electrode 34 which is in ohmic contact with the source area 26 at the center and connected to the source pad sections 29 and 32 at ends.

The dielectric layers 33 and the source electrode 35 are removed in etching by photolithography except for a belt-shaped area connecting the intrinsic device section 27 and the source pad sections 29 and 32.

Below the source pad sections 29 and 32, the gate electrode 31, and the drain electrode 28, holes are made in the GaAs substrate 22 and made electrically conductive to form via holes 37, 36, 38, and 39. In this way, the high-frequency semiconductor device 21 having the structure shown in FIGS. 3 to 5 is manufactured.

(Operations in the present embodiment)

In the high-frequency semiconductor device 21 manufactured in this way, the intrinsic device section 27 is formed by laminating the drain area 24, the intermediate area 25, and the source area 26, and has the vertical-type FET structure in which the channel area C is formed at one oblique surface.

The high-frequency semiconductor device 21 is mounted to a circuit board (not shown) such that the via hole 36, which is electrically connected to the input source pad section 32, is connected to an input signal line of the circuit board, the via hole 37, which is electrically connected to the output source pad section 29, is connected to an output signal line of the circuit board, the via holes 39, which are electrically connected to the drain electrode 28, and/or the via holes 38, which are electrically connected to the gate electrode 31, are connected to the ground line of the circuit board and are grounded. Therefore, at the input side, among electrodes constituting a microstripline 40A and sandwiching the dielectric layers 33, the source electrode 35 (hereinafter including the ohmic-contact electrode 34) serves as an RF signal line and the gate electrode 31 serves as an RF ground electrode. In the same way at the output side, among electrodes constituting a microstripline 40B and sandwiching the dielectric layers 33, the source electrode 35 serves as an RF signal line and the drain electrode 28 serves an RF ground electrode.

As described above, by inputting/outputting a signal from the lower surface of the GaAs substrate 22 through the via holes 36 to 39, noise and signal leakage caused by parasitic coupling between the input and output signal lines of the circuit board and the microstriplines 40A and 40B of the high-frequency semiconductor device 21 are reduced.

The characteristic impedance of each of the microstriplines 40A and 40B at both input and output matches that of the intrinsic device section 27. In other words, the line width, the line length, the line thickness (namely, the width, length, and thickness of the source electrode 35), film thickness between layers, the dielectric constant of film between layers (namely, the thickness and dielectric constant of the dielectric layers 33) of the microstriplines 40A and 40B for input and output are designed or adjusted such that the characteristic impedance of the intrinsic device section 27 matches the standard value (50 Ω) outside the device. When the microstriplines 40A and 40B are formed by use of the dielectric layers 33 having a relative dielectric constant $\epsilon$ of 2.5 to 5.0, a thickness of 10 μm, and a width of 25 μm, for example, a characteristic impedance of 40 to 70 Ω is obtained. The characteristic impedance is substantially equal to the input and output impedance of the intrinsic device section 27 having a gate width of 30 to 60 μm in the millimetric wave band, and the structure satisfying the matching condition can be obtained.

An RF signal input between the gate electrode 31 and the source electrode 35 at the input side through the via holes 38 and 36 is transferred through the microstripline 40A as an electromagnetic wave to reach the intrinsic device section 27. When the electromagnetic wave reaches the intrinsic device section 27, a carrier is injected from the source area 26 to the channel area C due to an electromagnetic mutual effect of the electromagnetic wave and the carrier in the intrinsic device section 27 between the gate electrode 31 and the source electrode 35, and the carrier reaches the drain area 24. When the carrier reaches the drain area 24, an electromagnetic wave generated by the carrier motion between the drain electrode 28 and the source electrode 35 is transferred through the microstripline 40B (the dielectric layer 33 between the drain electrode 28 and the source electrode 35) at the output side and is output to an output signal line of the circuit board through the via holes 39 and 37.

Since the gate electrode 31 is Schottky connected to the channel area C of the intrinsic device section 27, a depletion layer extends from the gate electrode 31 to the channel area C of the intrinsic device section 27. The extension of the depletion layer becomes larger or smaller according to the voltage difference between the source electrode 35 and the gate electrode 31, namely, the electromagnetic wave transferring through the microstripline 40A. If the depletion layer extends, a carrier injected from the microstripline 40A disposed between the drain electrode 28 and the source electrode 35 to the intrinsic device section 27 is reduced. If the depletion layer extends to the upper surface of the source area 26, a carrier cannot move and the high-frequency semiconductor device 21 is shut off. Therefore, this high-frequency semiconductor device 21 can be used as a circuit module for the millimetric wave and quasi-millimetric wave for amplification, oscillation, and modulation in the same way as a usual field effect transistor.

(Features of the present embodiment)

In improving the performance of a high-frequency semiconductor device, an advanced photolithography technology is required to reduce the gate length (or the distance between the source electrode and the source electrode) in a conventional horizontal-type FET. In contrast, when a vertical FET structure is used as in the high-frequency semiconductor device 21 according to the present invention, since the gate length is determined by the thickness of the epitaxial layer in the intermediate area 25, the degree of control is greatly improved. Whereas machining precision in the horizontal direction in a photolithography process using an electron beam is at most 0.01 μm, for example, in epitaxial growth the precision is 0.001 μm or less, which corresponds to a single atomic layer, and dimension precision can be controlled in the vertical direction. Each area in the intrinsic device section 27 described above has the composition and dimensions of a usual millimetric-wave compound semiconductor device, and each area can be manufactured by a usual fine machining technology in a vertical-type FET.

Figure 1:
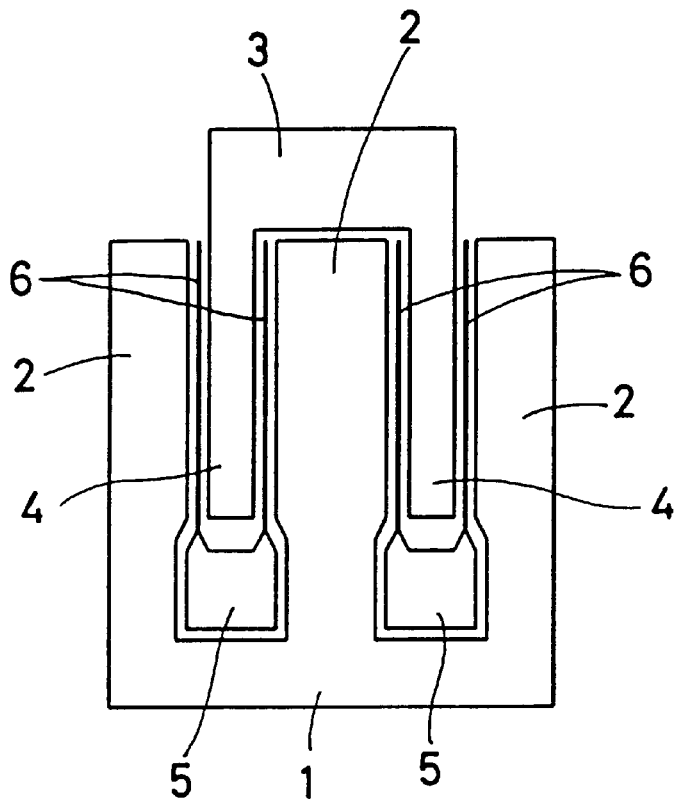
FIG. 1 is a plan view showing an electrode structure in a conventional horizontal-type FET.
Figure 2:
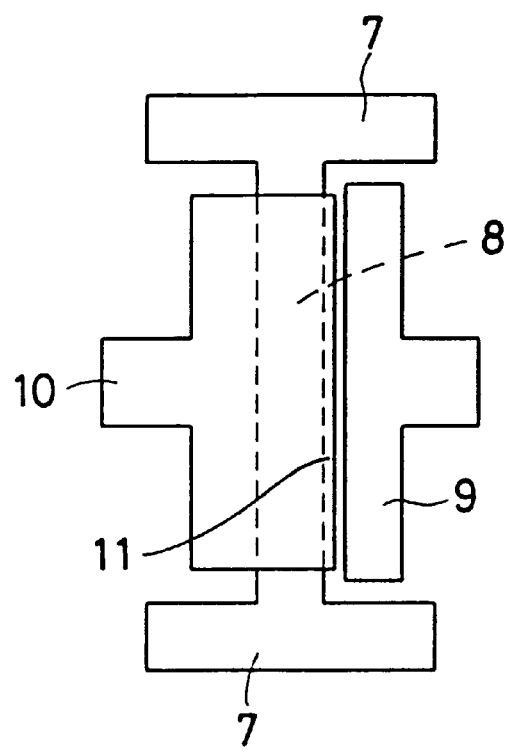
FIG. 2 is a plan view showing an electrode structure in a conventional FET having an air bridge gate structure.

Another method for improving the performance of a high-frequency semiconductor device is to reduce coupling in electromagnetic fields between the gate electrode and the source electrode and between the gate electrode and the drain electrode. In a conventional horizontal-type FET, electrodes are formed such that they do not intersect (see FIG. 1), or electrodes are formed such that the intersections of electrodes become as small as possible (see FIG. 2). In contrast, in the high-frequency semiconductor device 21 according to the present invention, by active use of coupling between the gate electrode 31 and the source electrode 35, and between the drain electrode 28 and the source electrode 35, these input and output electrodes 31 and 35 and 28 and 35 are made using microstripline-type waveguide structures to reduce parasitic coupling components (parasitic inductance and parasitic capacitance) of the gate electrode 31 and the drain electrode 28. In other words, since electromagnetic waves transfer in phase through the input and output microstriplines 40A and 40B between the upper and lower electrodes 31 and 35, and 28 and 35, parasitic coupling between the upper and lower electrodes does not substantially exist. In addition, unnecessary coupling between these electrodes and the semiconductor layer is seldom generated since the semiconductor layer is covered by the RF ground electrodes (namely, the drain electrode 28 and the gate electrode 31).

As for parasitic coupling between the drain electrode 28 and the gate electrode 31, by disposing them at both sides of the intrinsic device section 27, since a sufficient distance is provided, parasitic coupling between the drain electrode 28 and the gate electrode 31 is not a problem.

In the present embodiment, the input and output electrodes 31 and 35, and 28 and 35 can be connected to a coplanar line through via holes 38 and 36, and 39 and 37. As shown in FIG. 3, at both sides of via holes 36 and 37 electrically connected to the source electrode 35, via holes 38 and 39 electrically connected to the drain electrode 28 or the gate electrode 31 are provided. Therefore, in this embodiment, by connecting via holes 36 and 37 electrically connected to the source electrode 35 to the strip conductor of a coplanar line and connecting via holes 38 and 39 electrically connected to the drain electrode 28 or the gate electrode 31 to the ground conductor of the coplanar line, the lower surface of the high-frequency semiconductor device 21 is connected to the coplanar line.

In the above-described embodiment, a microstripline is used as a micro-wave transmission line. An RF signal may be fed back from the output to the input due to an electromagnetic field around a microstripline. In this case, when an H line structure is used in a micro-wave transmission line, since an electromagnetic field becomes a transmission mode in which the field is limited between the upper and lower electrodes, the feedback of an RF signal can be easily prevented.

SECOND EMBODIMENT

Figure 6A:
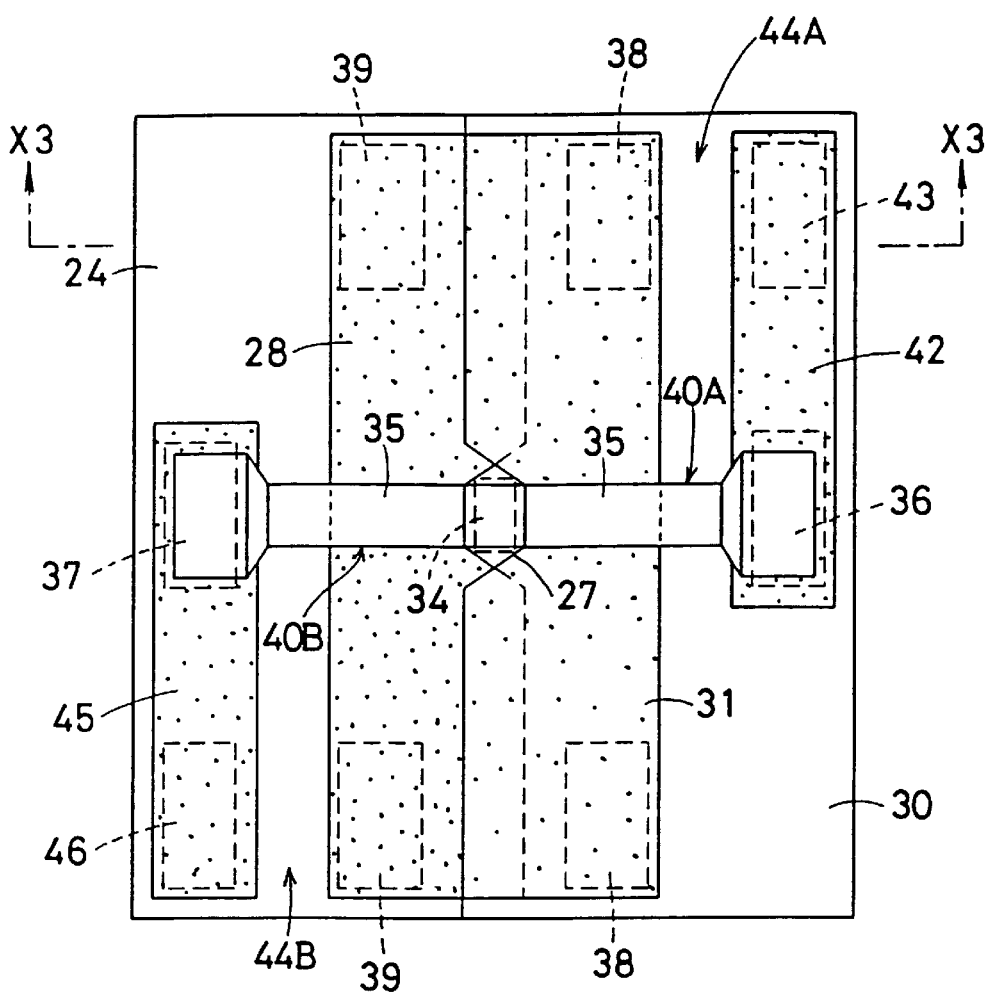
FIG. 6A is a plan view showing a structure of a high-frequency semiconductor device according to another embodiment of the present invention.
Figure 6B:
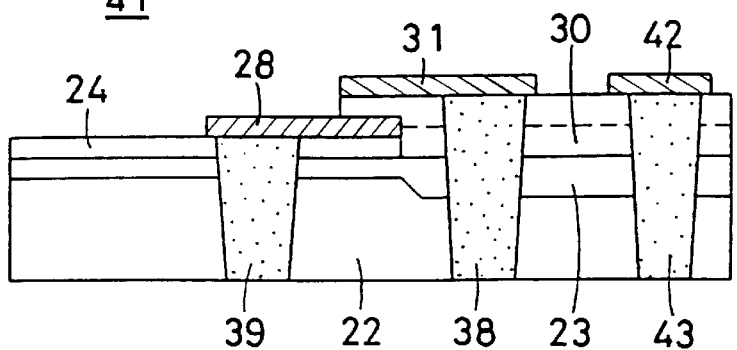
FIG. 6B is a cross sectional view taken on line X3—X3 shown in FIG. 6A.

FIGS. 6A and 6B are plan and cross sectional views, respectively, of a high-frequency semiconductor device 41 according to another embodiment of the present invention. In this high-frequency semiconductor device 41, a ground conductor 42 is provided in parallel to an edge of a gate electrode 31 to form an input slot line 44A between the edge of the gate electrode 31 and the ground conductor 42. The input slot line 44A is connected to an input microstripline 40A at a right angle so that the slot line 44A and the microstripline 40A are electromagnetically coupled. In the same way, a ground conductor 45 is provided in parallel to an edge of a drain electrode 28 to form an output slot line 44B between the edge of the gate electrode 28 and the ground conductor 45. The output slot line 44B is connected to an output microstripline 40B at a right angle so that the slot line 44B and the microstripline 40B are electromagnetically coupled.

An RF signal input to the slot line 44A transmits to an intrinsic device section 27 through the microstripline 40A. An RF signal output from the intrinsic device section 27 passes through the microstripline 40B and is output from the slot line 44B.

Since the slot lines 44A and 44B can be connected to a slot line on a circuit board through via holes 38 and 43, and 39 and 46, the device is easily connected to the circuit board formed by slot lines.

THIRD EMBODIMENT

Figure 7:
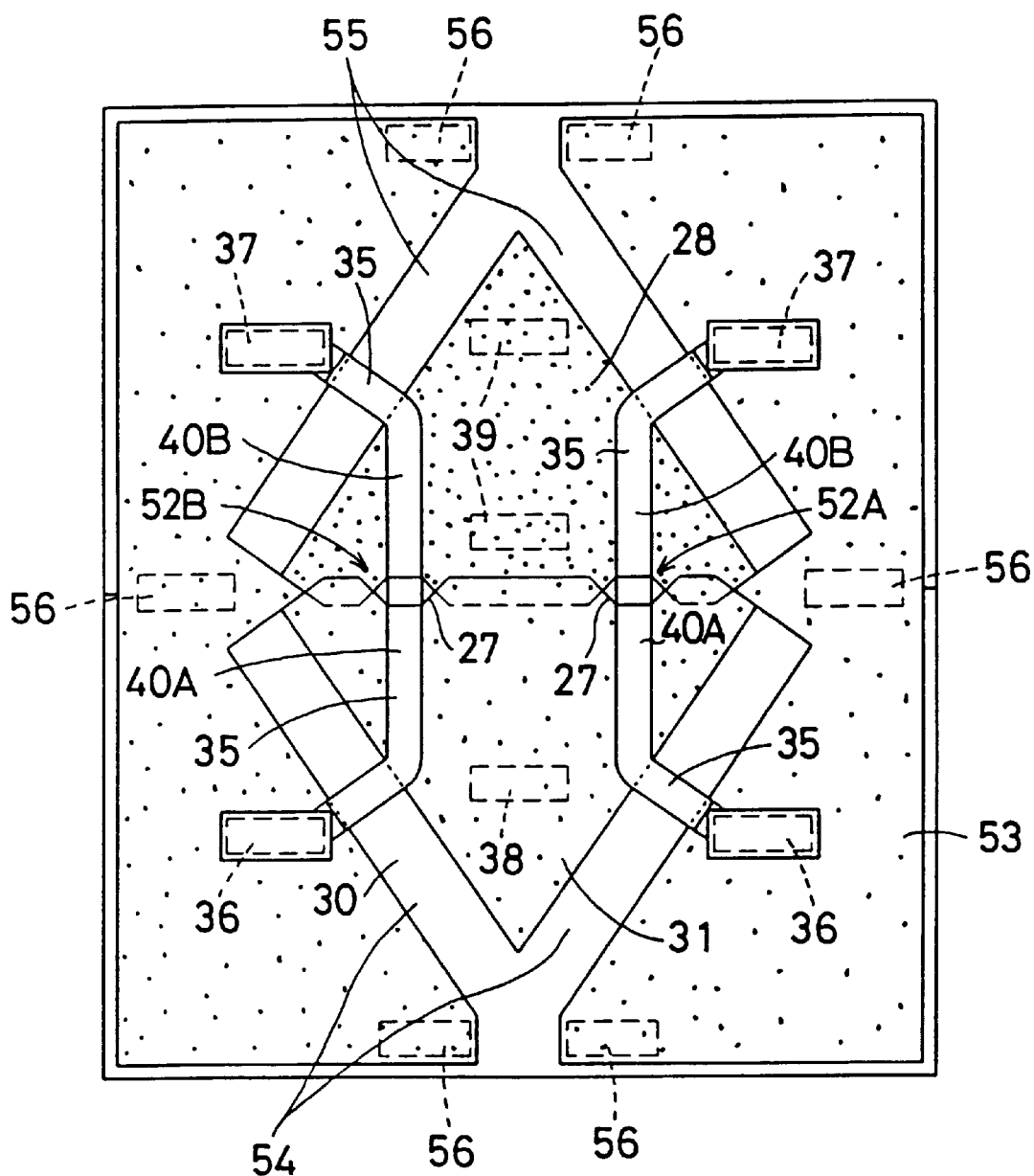
FIG. 7 is a plan view showing a structure of a high-frequency semiconductor device according to still another embodiment of the present invention.

FIG. 7 is a plan view showing a structure of a high-frequency semiconductor device 51 according to still another embodiment of the present invention. In this high-frequency semiconductor device 51, two intrinsic device sections 27 are formed with an appropriate distance being left therebetween, at the center of a GaAs substrate 22. Each intrinsic device section 27 of the high-frequency semiconductor device 51 is similar to the intrinsic device section 27 shown in FIG. 4 and includes a channel area C, a drain area 24 and a source area 26 (none of which are shown in FIG. 7). A gate electrode 31 formed at one intrinsic device section 27 is Schottky connected to the channel areas C in both intrinsic device sections 27, and a drain electrode 28 formed at the other intrinsic device section 27 is ohmic connected to the drain areas 24 of both intrinsic device sections 27. A source electrode 35 ohmic connected to the source area 26 of each intrinsic device section 27 extends from the intrinsic device section 27 to the gate electrode 31 in a belt shape, and an input microstripline 40A is formed with a dielectric layer 33 being placed between the gate electrode 31 and the source electrode 35. In the same way, an output microstripline 40B is formed with the dielectric layer 33 being placed between the drain electrode 28 and the source electrode 35 extending to the drain electrode 28 in a belt shape. Therefore, this high-frequency semiconductor device 51 has two high-frequency FETs 52A and 52B. At the input and the output of each of the high-frequency FETs 52A and 52B, microstriplines 40A and 40B are formed respectively.

In this embodiment, a ground conductor 53 is formed on the GaAs substrate 22, a Y-shaped branch-type slot line 54 is provided at the input between the gate electrode 31 and the ground conductor 53, and each branch of the branch-type slot line 54 is electromagnetically coupled with an input microstripline 40A. When the coupling point is placed at a position separated from a tip of the slot line 54 by λ/4 (λ: wavelength of electromagnetic wave), the coupling strength becomes maximum. In the same way, a Y-shaped branch-type slot line 55 is provided between the drain electrode 28 and the ground conductor 53 at the output, and each branch of the branch-type slot line 55 is electromagnetically coupled with an output microstripline 40B. Via holes 56 pass through the ground conductor 53.

When an RF signal is input to the input slot line 54, the RF signal is divided into two components in the slot line 54, each component passes through each microstripline 40A, and enters the high-frequency FET 52A or 52B. RF signals output from the high-frequency FETs 52A and 52B pass through the microstriplines 40B and are output to the slot line 44B. The two RF signals are combined in the slot line 44B and output from the slot line 44B. In this way, according to the high-frequency semiconductor device 51 having the structure in which the two high-frequency FETs 52A and 52B are connected in parallel, larger output power can be obtained than in a single high-frequency FET.

Since the gate electrode 31 and the drain electrode 28 are connected to the intrinsic device sections 27 with wide wiring patterns, each electrode resistance can be suppressed to a low level.

FOURTH EMBODIMENT

Figure 8:
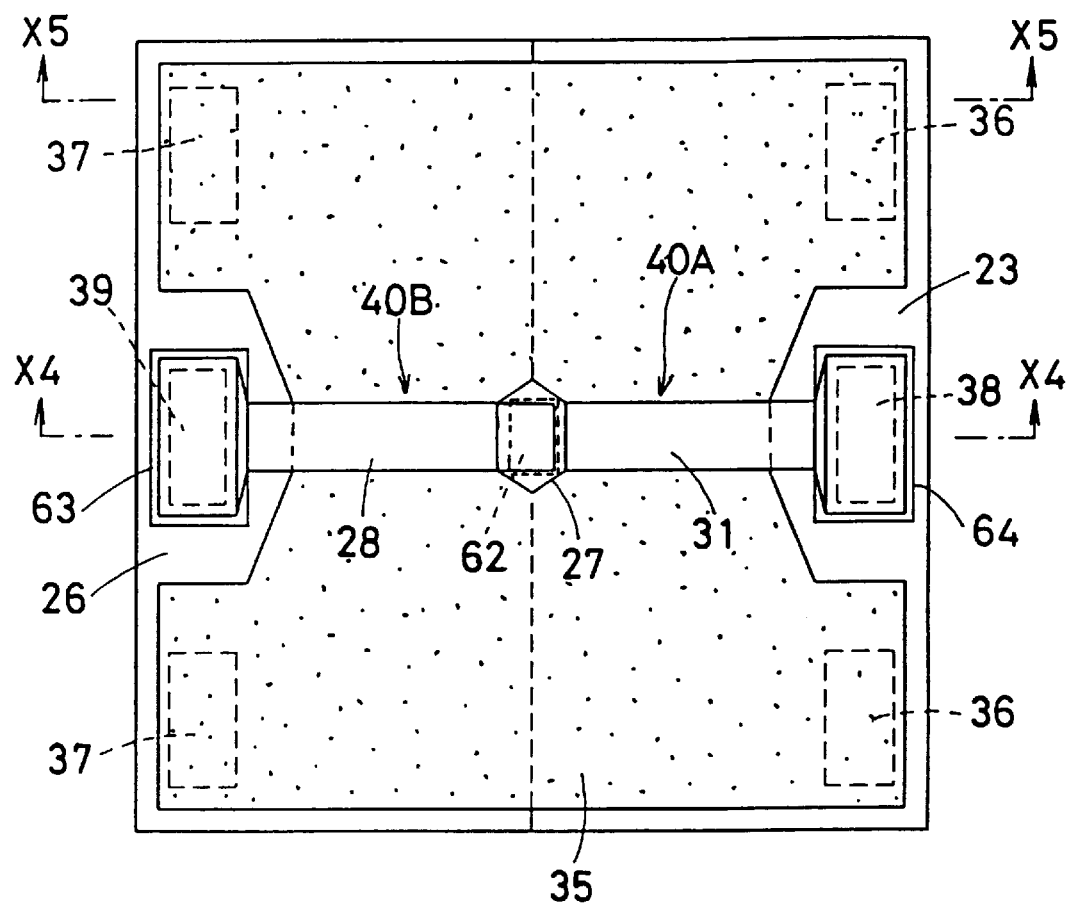
FIG. 8 is a plan view showing a structure of a high-frequency semiconductor device according to yet another embodiment of the present invention.
Figure 9:
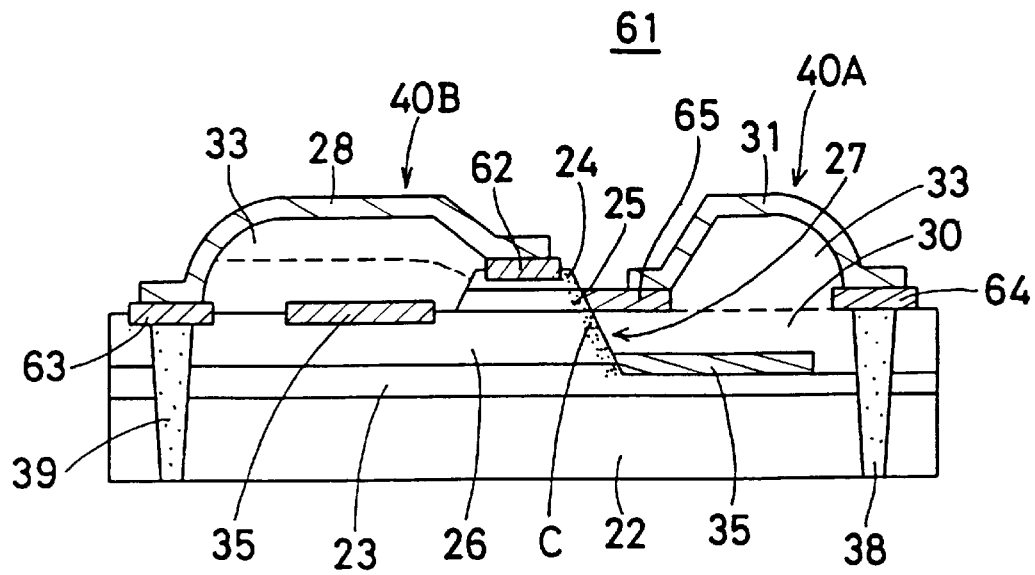
FIG. 9 is a cross sectional view taken on line X4—X4 shown in FIG. 8.
Figure 10:
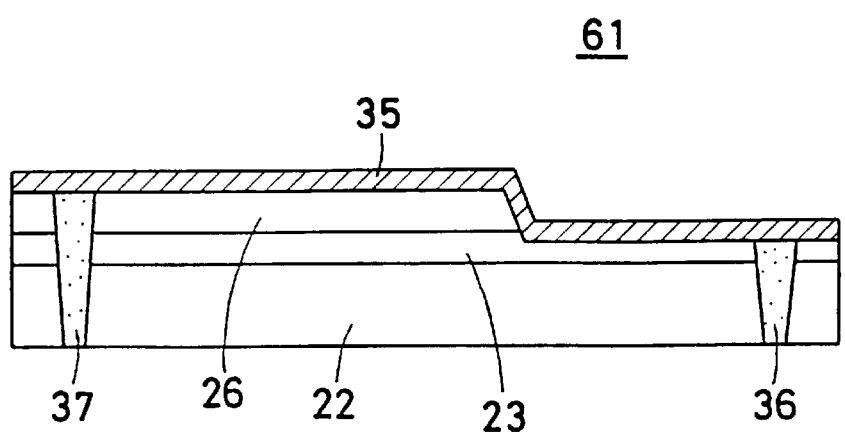
FIG. 10 is a cross sectional view taken on line X5—X5 shown in FIG. 8.

FIG. 8 is a plan view of a high-frequency semiconductor device 61 according to a further embodiment of the present invention. FIG. 9 is a cross sectional taken on line X4—X4 shown in FIG. 8 and FIG. 10 is a cross sectional taken on line X5—X5 shown in FIG. 8. This high-frequency semiconductor device 61 has an intrinsic device section 27 having a vertical-type FET structure in which a source area 26, an intermediate area 25, and a drain area 24 are laminated from the bottom and a channel area C is formed at one oblique surface by ion injection.

In this embodiment, at almost the entire area except portions where the intrinsic device section 27, a gate pad section 64, and a drain pad section 63 are formed, source electrodes 35 are formed above a GaAs substrate 22. More specifically, a source electrode 35 is formed on an undoped GaAs layer 23 below the intrinsic device section 27 at the input half, the source electrode 35 is formed on the source area 26 extending from the intrinsic device section 27 at the output half, and the source electrode 35 at the input half and the source electrode 35 at the output half have a difference in level.

An ohmic contact electrode 62 is formed on the upper surface of the intrinsic device section 27, and a drain electrode 28 electrically connected to the ohmic contact electrode 62 extends in a belt shape toward the output side along the upper surface of a dielectric layer 33 formed in a belt shape. The drain electrode 28 is connected to a drain pad section 63 formed at an end of the source area 26. A Schottky contact electrode 65 Schottky-connected to a channel area C of the intrinsic device section 27 is provided on an insulating layer 30, and a gate electrode 31 electrically connected to the Schottky contact electrode 65 extends in a belt shaped toward the input side along the upper surface of a dielectric layer 33 formed in a belt shape. The gate electrode 31 is connected to a gate pad section 64 formed at an end of the insulating layer 30.

In this embodiment, the source area 26, the intermediate area 25, and the drain area 24 are laminated in the intrinsic device section 27 in the order reverse to that in the embodiment shown in FIG. 3. A microstripline 40A is formed at the input side by the dielectric layer 33 formed between the source electrode 35 and the gate electrode 31 (hereinafter including the Schottky contact electrode 65), and a microstripline 40B is formed at the output side by the dielectric layer 33 formed between the source electrode 35 and the drain electrode 28 (hereinafter including the ohmic contact electrode 62). In this embodiment, the gate electrode 31 serves as an input RF signal line, the drain electrode 28 serves as an output RF signal line, and the source electrode 35 serves as an RF ground electrode. It is needless to say that the characteristic impedance of each of the microstriplines 40A and 40B at the input and output sides matches that of the intrinsic device section 27.

In the same way as in the embodiment shown in FIG. 3, the device can also be connected to a coplanar line provided for a circuit board, in the present embodiment. Since the gate electrode 31 transfers an input RF signal in the microstripline 40A, the drain electrode 28 transfers an output RF signal in the microstripline 40B, and both electrodes are electrically separated in the same way as in a conventional FET, an RF signal is seldom fed back from the output side to the input side. In addition, since the source electrode 35 is formed at almost the entire area above the GaAs substrate 22, the electrode is easily formed in this embodiment.

FIFTH EMBODIMENT

Figure 11:
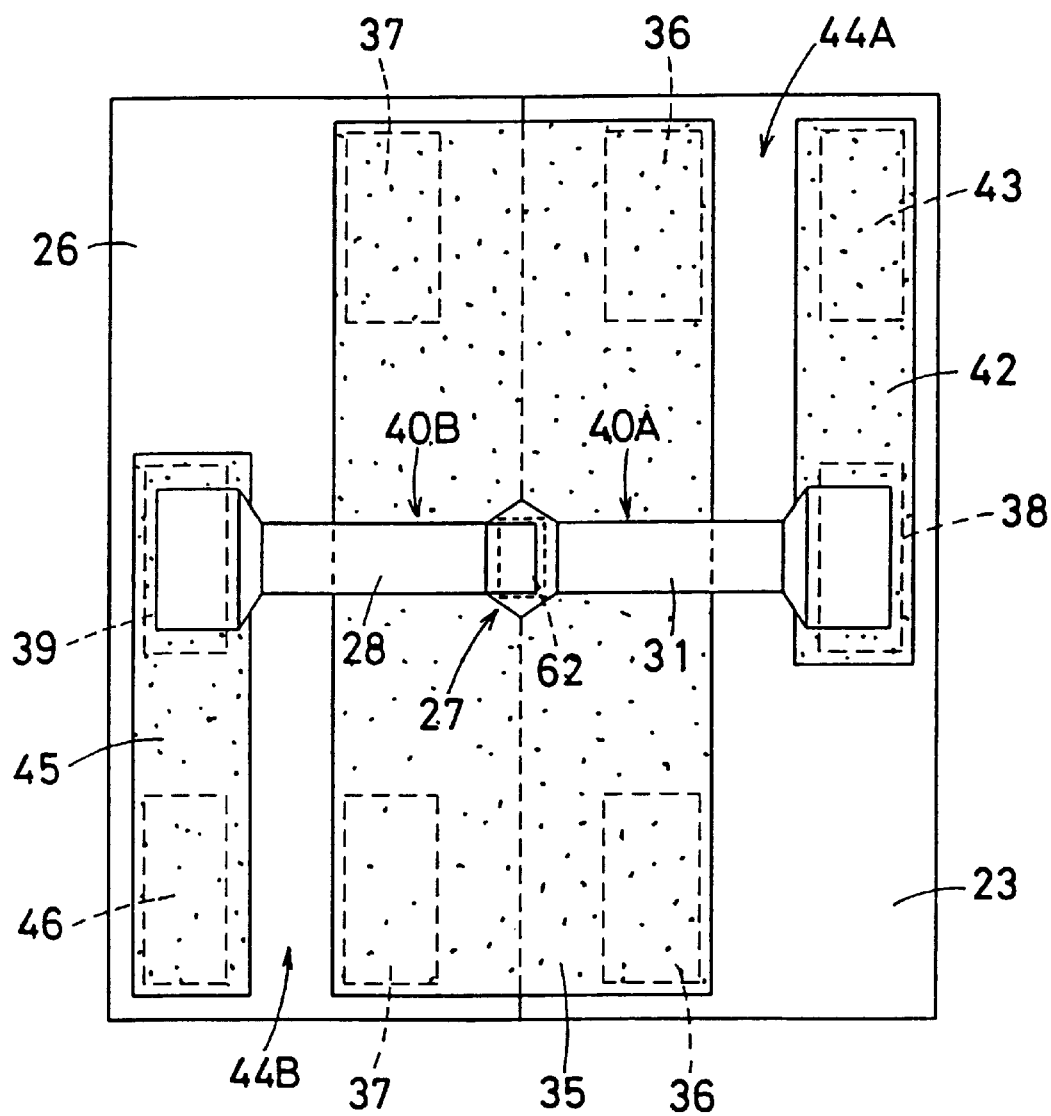
FIG. 11 is a plan view showing a structure of a high-frequency semiconductor device according to a further embodiment of the present invention.

FIG. 11 is a plan view showing a high-frequency semiconductor device 71 according to a still further embodiment of the present invention. The high-frequency semiconductor device 71 is an FET having an intrinsic device section 27 and microstriplines 40A and 40B with the structure shown in FIG. 8, in which the input microstripline 40A is electromagnetically coupled with an input slot line 44A, and the output microstripline 40B is electromagnetically coupled with an output slot line 44B in the same way as in the embodiment shown in FIGS. 6A and 6B. In the present embodiment, the device can also be easily connected to a circuit board provided with a slot line.

SIXTH EMBODIMENT

Figure 12:
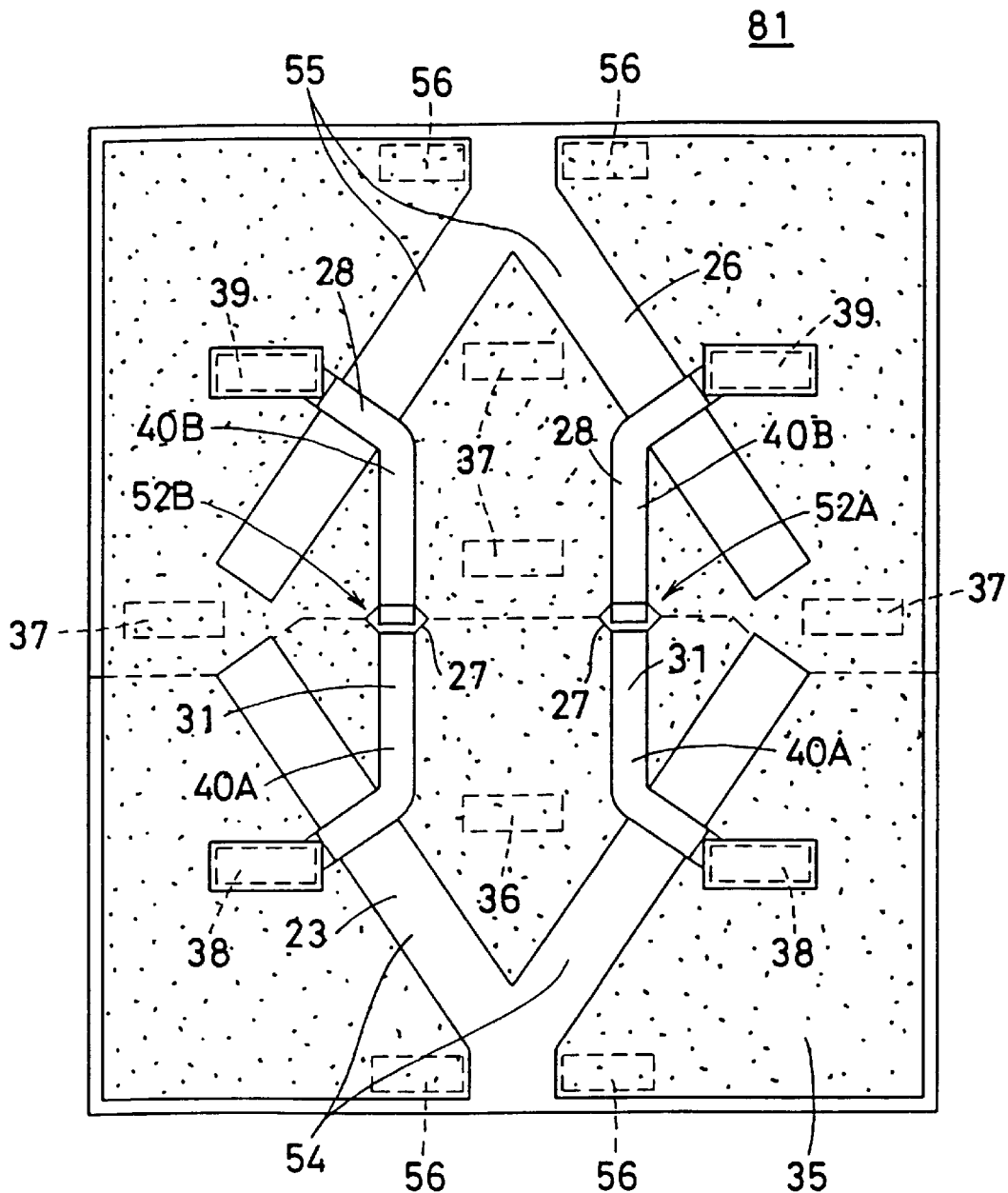
FIG. 12 is a plan view showing a structure of a high-frequency semiconductor device according to a yet further embodiment of the present invention.

FIG. 12 is a plan view showing a high-frequency semiconductor device 81 according to a yet further embodiment of the present invention. In this embodiment, intrinsic device sections 27 having the structure shown in FIG. 8 are provided at an appropriate distance apart, and microstriplines 40A and 40B having the structure shown in FIG. 8 are formed at the input and output sides of each intrinsic device section 27. Each branch section of a Y-shaped branch-type input slot line 54 is electromagnetically coupled with an input microstripline 40A and each branch section of a Y-shaped branch-type output slot line 55 is electromagnetically coupled with an output microstripline 40B.

Also in this embodiment, an RF signal input to the slot line 54 at the input end is divided in the slot line 54, transfers to a microstripline 40A, and is input to a high-frequency FET 52A. An RF signal output from the high-frequency FET 52A transfers through a microstripline 40B to the slot line 55, is combined in the slot line 55, and output from the slot line 55. Therefore, even in this embodiment, larger output power can be obtained than that of a single high-frequency FET.

In a high-frequency semiconductor device according to the present invention, since an intrinsic device section is of the vertical type, the gate length can be reduced while a high degree of control is maintained. Since a micro-wave transmission line serves as a connection section of an intrinsic device section, an input signal transfers through a waveguide without disturbing an electromagnetic field distribution. Therefore, drawbacks caused by parasitic inductance or parasitic capacitance in a semiconductor device having a conventional structure can be eliminated. According to the present invention, a low-noise millimetric-wave semiconductor device having a high power gain and high operating frequencies is made with a high degree of control, and the characteristics thereof are successfully repeated.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency semiconductor device comprising:
   an intrinsic device section partially formed by laminating a drain area, a channel area, and a source area above an insulating substrate;
   a first micro-wave transmission line formed between one of a drain electrode connected to said drain area and an electrode section electrically connected to said drain electrode and one of a source electrode connected to said source area and an electrode section electrically connected to said source electrode; and
   a second micro-wave transmission line formed between one of a gate electrode connected to said channel area and an electrode section electrically connected to said gate electrode and one of a source electrode connected to said source area and an electrode section electrically connected to said source electrode.

2. A high-frequency semiconductor device comprising:
   an intrinsic device section partially formed by laminating a drain area, a channel area, and a source area in this order above an insulating substrate;
   a first micro-wave transmission line formed between one of a drain electrode connected to said drain area and an electrode section electrically connected to said drain electrode and one of a source electrode connected to said source area and an electrode section electrically connected to said source electrode formed oppositely through one of a dielectric layer above said drain electrode and said electrode section electrically connected to said drain electrode; and
   a second micro-wave transmission line formed between one of a gate electrode connected to said channel area and an electrode section electrically connected to said gate electrode and one of a source electrode connected to said source area and an electrode section electrically connected to said source electrode formed oppositely through one of a dielectric layer above said gate electrode and said electrode section electrically connected to said gate electrode.

3. A high-frequency semiconductor device comprising:
   an intrinsic device section partially formed by laminating a source area, a channel area, and a drain area in this order above an insulating substrate;
   a first micro-wave transmission line formed between one of a source electrode connected to said source area and an electrode section electrically connected to said source electrode and one of a gate electrode connected to said channel area and an electrode section electrically connected to said gate electrode formed oppositely through one of a dielectric layer above said source electrode and said electrode section electrically connected to said source electrode; and
   a second micro-wave transmission line formed between one of a source electrode connected to said source area and an electrode section electrically connected to said source electrode and one of a drain electrode connected to said drain area and an electrode section electrically connected to said drain electrode formed oppositely through one of a dielectric layer above said source electrode and said electrode section electrically connected to said source electrode.

4. A high-frequency semiconductor device according to one of claims 1, 2, and 3, wherein a plurality of said intrinsic device sections are disposed above said insulating substrate and wherein each of said plurality of said intrinsic device sections has respective first and second micro-wave transmission lines connected thereto.

5. A high frequency semiconductor device according to one of claims 1, 2 and 3, wherein said first and second microwave transmission lines are first and second microstrip lines.

6. A high frequency semiconductor device according to claim 5, further including a first slot line connected to the first microstrip line and a second slot line connected to the second microstrip line.

7. A high frequency semiconductor device according to claim 6, wherein the first and second slot lines are connected to the first and second microstrip lines, respectively, at right angles thereto.

8. A high frequency semiconductor device according to one of claims 1, 2 and 3, wherein two intrinsic device sections are disposed above said insulating substrate, each of said intrinsic device sections having respective first and second microwave transmission lines connected thereto, said first and second microwave transmission lines being first and second microstrip lines and further including first and second Y-shaped slot lines, each of which has first and second branches, the first and second branches of the first Y-shaped slot line being connected respectively to the first microstrip lines of the two intrinsic device sections, and the first and second branches of the second Y-shaped slot line being connected respectively to the second microstrip lines of the two intrinsic device sections.

9. A high-frequency semiconductor device according to claim 1 wherein said first microwave transmission line is formed by opposing edges of the drain electrode and the source electrode and a dielectric therebetween, and said second transmission line is formed by opposing edges of the gate electrode and the source electrode and another dielectric therebetween.

* * * * *